United States Patent
Janos et al.

(10) Patent No.: US 6,597,003 B2
(45) Date of Patent: Jul. 22, 2003

(54) TUNABLE RADIATION SOURCE PROVIDING A VUV WAVELENGTH PLANAR ILLUMINATION PATTERN FOR PROCESSING SEMICONDUCTOR WAFERS

(75) Inventors: Alan C. Janos, Darnestown, MD (US); Daniel B. Richardson, Westminster, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 217 days.

(21) Appl. No.: 09/905,058

(22) Filed: Jul. 12, 2001

(65) Prior Publication Data

US 2003/0015669 A1 Jan. 23, 2003

(51) Int. Cl.[7] .......................... H01J 37/32; H01J 61/02; H01J 61/12; H01J 61/16
(52) U.S. Cl. .................................... 250/492.2
(58) Field of Search .................. 250/492.1, 492.2; 438/795

(56) References Cited

U.S. PATENT DOCUMENTS

| | | |
|---|---|---|
| 4,501,993 A | 2/1985 | Mueller et al. |
| 4,507,587 A | 3/1985 | Wood et al. |
| 4,859,906 A | 8/1989 | Ury et al. |
| 4,887,008 A | 12/1989 | Wood |
| 4,978,891 A | 12/1990 | Ury |
| 5,136,170 A * | 8/1992 | Gellert ................. 250/492.1 |
| 5,424,550 A | 6/1995 | Kawano et al. |
| 5,512,253 A | 4/1996 | Woodbridge et al. |
| 5,712,487 A | 1/1998 | Adachi et al. |
| 5,798,611 A | 8/1998 | Dolan et al. |
| 5,804,992 A | 9/1998 | Lee |
| 5,861,633 A | 1/1999 | Mandellos |
| 5,863,327 A * | 1/1999 | Thakur ..................... 118/50.1 |
| 5,921,002 A | 7/1999 | Scheufler et al. |
| 6,126,095 A | 10/2000 | Matheson et al. |
| 6,133,694 A | 10/2000 | Cekic et al. |

* cited by examiner

Primary Examiner—Huan Tran
(74) Attorney, Agent, or Firm—Watts, Hoffmann, Fisher & Heinke, Co., L.P.A.

(57) ABSTRACT

A radiation source constructed in accordance with the invention is particularly suited for use in processing semiconductor wafers. An exemplary embodiment of the invention includes a base electrode having a two dimensional surface bounding one side of a radiation emitting region. An ionizable, excimer gas is present in the radiation emitting region. The excimer gas, when energized, emits radiation in the UV and/or VUV wavelengths. A two dimensional dielectric radiation transmissive layer bounds an opposite side of the radiation emitting region and transmits radiation to a wafer treatment region. Disposed between the dielectric radiation transmissive layer and a protective radiation transmissive window is a two dimensional matrix or screen electrode defining a plane generally parallel to the two dimensional surface of the base electrode region. A power supply coupled to the base and matrix electrodes to energize the electrodes and the eximer gas causing emission of UV and/or VUV radiation. The range of wavelengths transmitted to the wafer treatment region can be "tuned" by using a filter disposed adjacent to the protective window which functions to block transmission of selected wavelengths of emitted radiation.

29 Claims, 9 Drawing Sheets

TUNABLE RADIATION SOURCE PROVIDING A VUV WAVELENGTH PLANAR ILLUMINATION PATTERN FOR PROCESSING SEMICONDUCTOR WAFERS

FIELD OF THE INVENTION

The present invention concerns a radiation source for producing a planar or flat panel illumination pattern of vacuum ultraviolet (VUV) wavelength radiation that is particularly suited for use in processing of semiconductor wafers up to and beyond 300 millimeters in diameter.

BACKGROUND ART

There are a number of uses of short wavelength radiation in the processing of semiconductor wafers for the production of integrated circuits. Short wavelength radiation includes the ultraviolet (UV) (<400 nanometers (nm.)) and vacuum ultraviolet (VUV) (100–200 nm.) regions. This invention addresses a radiation source capable of producing high intensity, uniform UV and VUV wavelength radiation for the processing of semiconductor wafers.

Processing of semiconductor wafers is evolving toward fabrication of smaller features (<0.25 micron) on a wafer. This requires the use of new chemistries, resists, and processes. Many of these new chemistries, materials, and processes require high energy photons to overcome reaction thresholds. Photostabilization of some of the new resists require high energy photons. Ashing and etching of materials and resists in particular can be improved with use of VUV wavelength radiation. High energy photons can excite gases and surfaces in order to enhance reaction processes and reaction rates. Short wavelength radiation is also useful for EPROM erasure, FLASH erasure, and non-volatile memory erasure.

In the present state of the art, there are no acceptable radiation sources for use in the VUV region of wavelengths for treatment of semiconductor wafers. Furthermore, existing radiation sources suffer from one or more of the following shortcomings:

a. Present sources are too low in intensity or have marginal intensity levels, thus, providing inadequate throughput rates.

b. Present sources have large non-uniformity in light output over a two-dimensional area typical of a semiconductor wafer.

c. Present sources are too expensive or complicated to justify use.

d. Present sources have fixed wavelength.

e. Present sources do not provide large enough illuminated area coverage.

f. Present sources produce undesirable wavelengths in addition to desired wavelengths of radiation (e.g., infrared (IR) radiation).

g. present sources can be too large to justify use in a semiconductor fabrication facility due to large "footprint" or floor space required.

h. Present sources require manual loading of wafers.

i. Present sources are too expensive.

j. Present sources utilize bulbs with electrodes, thereby leading to reduced lifetime and degraded output during usable life.

Present technology provides some radiation sources producing radiation having wavelengths below 200 nm. Such radiation sources suffer from unacceptable levels of nonuniformity of the irradiance over the surface of the wafer. This problem usually stems from the use of finite sized lamps such as linear lamps. These lamp configurations are not compatible with a wafer disk requiring uniform illumination over a two dimensional circular area with diameters ranging from 150 millimeters (mm.), or smaller, up to 300 mm., or larger.

SUMMARY OF THE INVENTION

The present invention is directed to a tunable UV and VUV wavelength radiation source particularly useful in the treatment of semiconductor wafers. A radiation source constructed in accordance with the invention provides desired wavelengths, intensity and two dimensional planar uniformity of UV and VUV radiation for the treatment of semiconductor wafer workpieces having a diameter of up to 300 mm. or greater. The radiation source of the present invention provides uniformity of illumination intensity across a 300 mm. planar radiation pattern of a few percent or less compared to existing sources on the market which typically claim +/– 15% nonuniformity of illumination intensity.

Advantageously, the radiation source of the present invention is tunable in that it can be operated at a number of distinctly different wavelengths in the region 100–200 nm. or above. In one preferred embodiment, the radiation source output radiation wavelengths can be fine tuned using a gas filter.

The radiation source of the present invention can provide a two dimensional planar radiation source in a selected one of a variety of shapes (e.g., square, circular, etc.). The radiation source is tunable to achieve a desired output radiation wavelength range. Course tuning of the wavelength range emitted by the radiation source is achieved by selecting an ionizable gas that, when energized, produces radiation in a desired wavelength range via excimer excitation of the gas molecules. Additionally, in one preferred embodiment of the present invention, fine tuning of emitted radiation wavelength is achieved though the use of an absorber gas, such as oxygen, which absorbs or filters certain wavelengths of emitted radiation such that a narrower range of wavelengths impinges the target wafer with a modified range of wavelengths. Since different processes are best served by the radiation of different wavelengths, the radiation source of the present invention advantageously provides for flexibility not found in prior art radiation sources.

The present invention is directed to a radiation source for emitting a planar pattern of radiation for use in processing semiconductor wafers. Typically, the emitted radiation will be in the UV or VUV wavelength ranges. The radiation source of the present invention includes: a base electrode having a two dimensional surface bounding a radiation emitting region; a dielectric radiation transmissive member spaced from the base electrode and bounding the radiation emitting region; a two dimensional electrode screen or matrix that is in contact with the dielectric member in a plane generally parallel to the two dimensional surface of the base electrode, the electrode matrix defining a plurality of openings permitting transmission of the emitted radiation through the electrode matrix to a wafer treatment region; a power supply for energizing the base electrode and the electrode matrix; and an ionizable gas disposed in the radiation emitting region for ionization by a field set up between the base electrode and the electrode matrix and emission of radiation via excimer excitation.

In one preferred embodiment of the present invention, the source additionally includes a second protective radiation transmissive member which contacts the electrode matrix and urges the electrode matrix against the dielectric member and functions to protect the electrode matrix from exposure to contaminants in the wafer treatment region and reinforce the dielectric member. Depending on the desired dimension and strength of material characteristics of the dielectric member and the electrode matrix and the pressure differential between the wafer treatment region and the radiation transmission region, the radiation source may additionally include one or more spacer elements inserted in the radiation emitting region between the dielectric member and the base electrode to provide a uniform cross sectional area within the radiation emitting region.

In another preferred embodiment of the radiation source of the present invention, the source gas supply routes a selection of different possible ionizable gases capable of excimer excitation to the radiation emitting region to control a wavelength of radiation emitted by the source. Such selection of a gas from a group of excimer excitation capable gases permits "course" tuning of the wavelengths generated in the radiation emitting region, i.e., select a gas that generates a desired range of wavelengths when undergoing excimer transitions.

In another preferred embodiment of the radiation source of the present invention, a third radiation transmissive member is disposed in a spaced apart relationship from the second protective member to define a absorber gas filter chamber into which an absorber gas, such as oxygen, is injected. The absorber gas filters or absorbs selected wavelengths of radiation emitted from the radiation emitting region by the ionizable gas. The gas filter provides for fine tuning of the radiation output wavelengths.

These and other objects, advantages and features of the invention will become better understood from a detailed description of an exemplary embodiment of the invention which is described in conjunction with the accompanying drawings.

BEST MODE FOR PRACTICING THE PRESENT INVENTION

First Preferred Embodiment of Radiation Source 10

Figure 1:
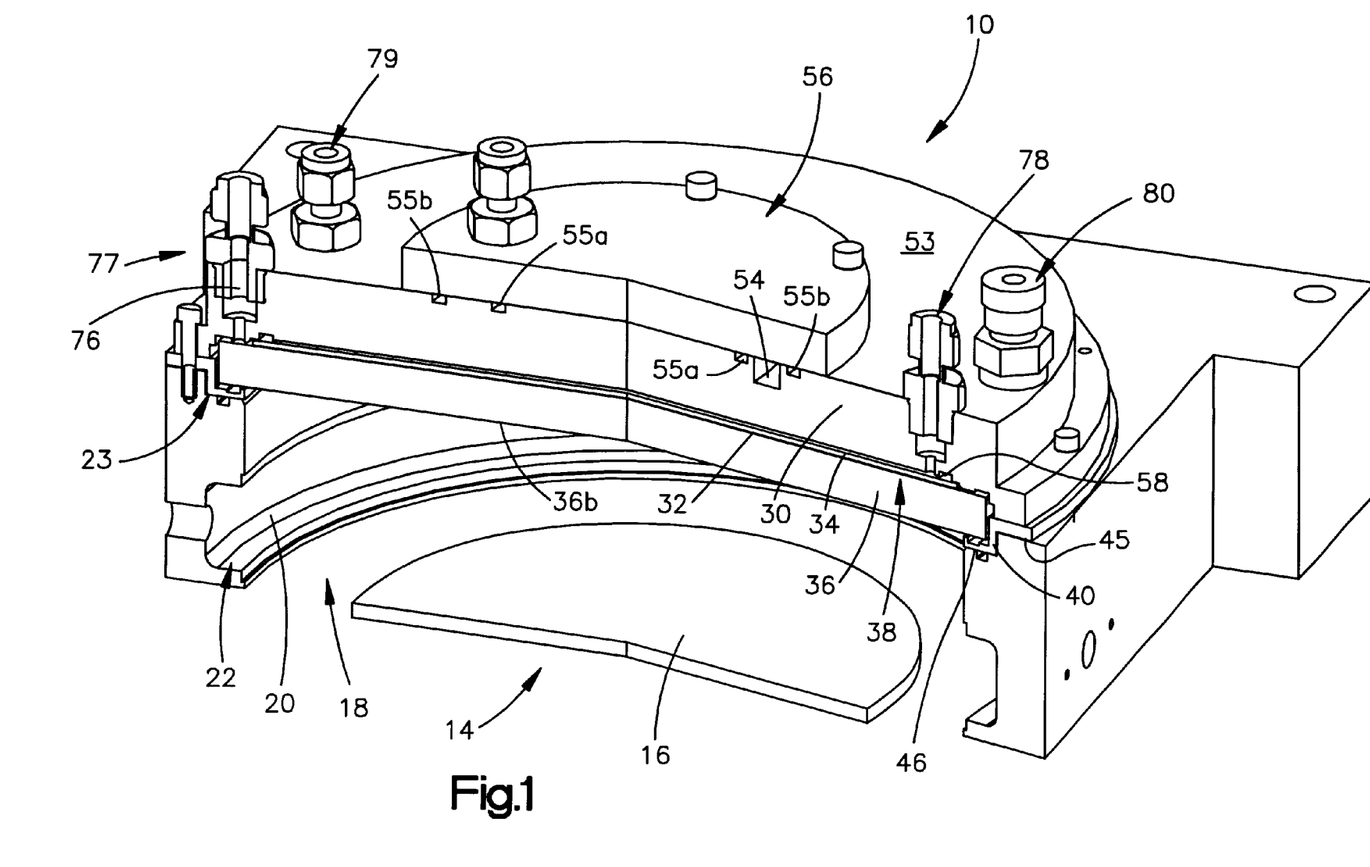
FIG. 1 is a cut-away perspective view of a first preferred embodiment of a radiation source constructed in accordance with the invention mounted to a semiconductor wafer confining structure for treatment of semiconductor wafers.

A first preferred embodiment of a light or radiation source of the present invention is shown generally at 10 in FIGS. 1–5. When energized by an appropriate power supply 33 (shown schematically in FIG. 3), the radiation source 10 produces a planar source of radiation of a desired wavelength. One advantageous use of the radiation source 10 is to treat semiconductor wafers with ultraviolet (UV)(<400 nm.) and vacuum ultraviolet (VUV) (100–200 nm.) wavelength radiation. As is shown in FIG. 1, the radiation source 10 may advantageously be part of a semiconductor wafer treatment system 14 for treating a semiconductor wafer 16 with uniform, planar pattern of radiation of a desired wavelength. The source 10 generates the planar radiation pattern by means of excimer excitation of a selected ionizable gas.

The wafer 16 is supported within a wafer treatment chamber 18 defined by a generally circular wall 20 of a wafer confining structure 22. The radiation source 10 is mounted to the wafer confining structure 22 and radiation emitted by the source 10 is directed into the wafer confining structure 22. The radiation source 10 of the present invention may advantageously treat semiconductor wafers up to 300 mm. in diameter. It should be noted, however, that the radiation source 10 could be increased in size to treat even larger diameter wafers. The radiation source 10 of the present invention provides a two-dimensional, "flat-panel" type radiation source which emits a desired range of wavelengths and is characterized by a high uniformity of irradiance and a high intensity output. Depending on the ionizable gas selected, the radiation source 10 is capable of producing a planar pattern of uniform, high intensity radiation in the UV wavelength range (<400 nm.) or, more specifically, in the VUV wavelength range (100–200 nm.).

The radiation source 10 includes a first and second generally planar, two dimensional electrodes 30, 32, the power supply 33 coupled to the first and second electrodes 30, 32 for energizing the electrodes. The radiation source 10 further includes a dielectric, radiation-transmissive window or layer 34 positioned adjacent to the second electrode 32 and which-is spaced apart from the first electrode 30. The first or base electrode 30 and the dielectric layer 34 bound and define a ionizing gas region 35 (shown in FIGS. 2 and 4) into which an ionizable gas 35a is injected. The second electrode 32 is a matrix or mesh screen having a low profile and a plurality of openings making the electrode semitransparent to emitted radiation.

When energized by the power supply 33, the electrodes 30, 32 generate an electric field that causes eximer excitation of the ionizable gas 35a in the gas region 35 resulting in emitted radiation in a range of wavelengths that is characterized by the excimer transition of the specific ionizable gas chosen. Because the electrodes 30, 32 are two dimensional with respect to surface areas facing the gas region 35, the emitted radiation of the radiation source 10 has a uniform, two dimensional planar intensity pattern. The emitted radiation passes through dielectric layer 34 and the electrode screen 32 and into the wafer treatment chamber 18 to treat the wafer 16.

Advantageously, the radiation source 10 may also include a thicker, radiation transmissive protective window 36. The window 36 protects the electrode screen 32 from heated gases present and/or sputtering occurring in the wafer treatment chamber 18. As will be explained below, the protective window 36 forms an integral assembly 38, which includes the electrode screen 32 and the dielectric layer 34, to reinforce and support the thinner dielectric layer 34 and permits operation of the radiation source 10 using vacuum or hyperatmospheric conditions in the ionizable gas region 35 for greater radiation intensity.

Figure 2:
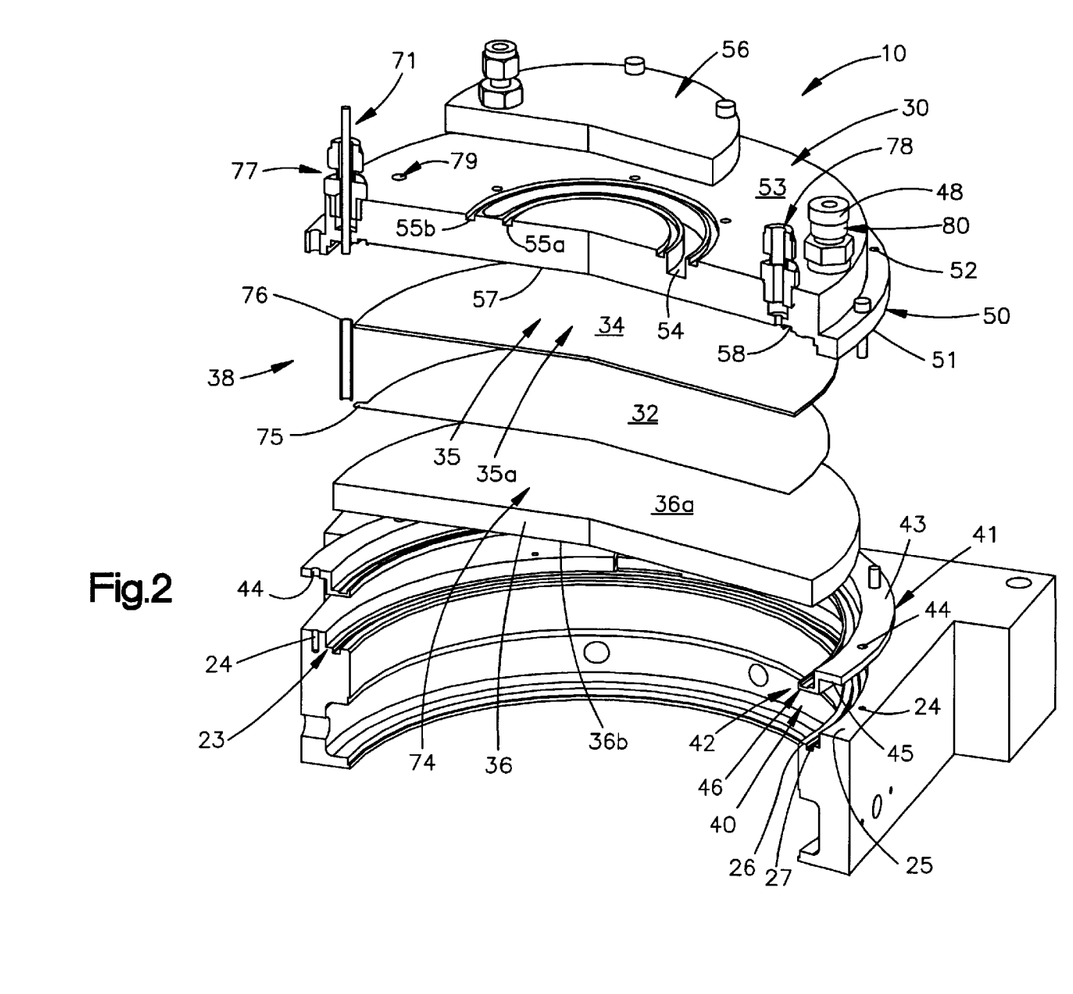
FIG. 2 is an exploded cut-away perspective view of the light source of FIG. 1.
Figure 3:
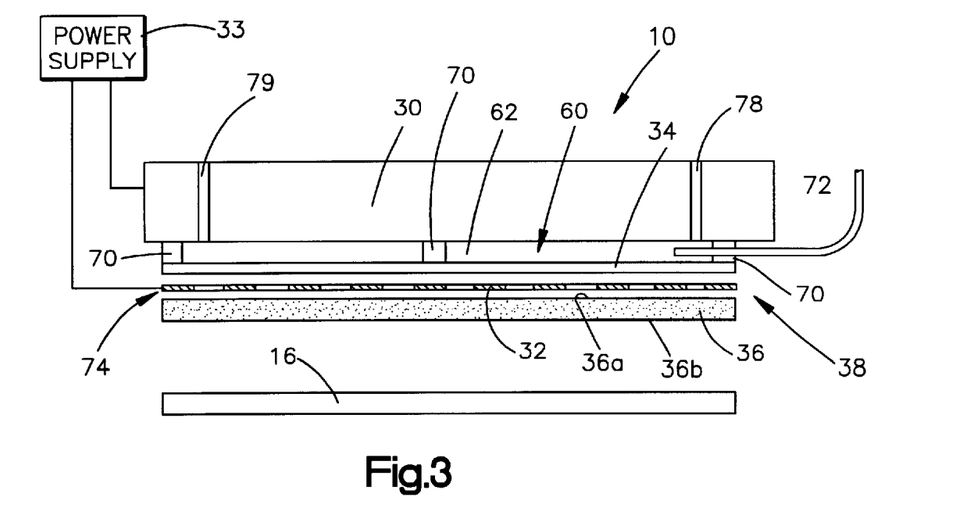
FIG. 3 is a schematic sectional depiction of the radiation source of FIG. 1.

As can best be seen in FIGS. 1, 2 and schematically in FIG. 3, the base electrode 30 includes a gas inlet 78 and a gas outlet 79 providing for entry and exit ports for ionizing gas 35a confined in the gas region 35 defined between the base electrode 30 and the electrode screen 32. The base electrode 30 also includes a pressure evacuation pumping port 80 to permit evacuation of an "enclosed space" or gap region 74 between the dielectric layer 34 and the protective window 36. Evacuating the enclosed space or gap region 74 causes the dielectric layer 34 and the protective window 36 to "sandwich" the electrode screen 32 between them resulting in reinforcement of the thinner dielectric window 34 by the stronger and thicker protective window 36 and forming the integral assembly 38.

Annular Rim 40

The radiation source 10 includes an annular rim 40 which provides spacing and peripheral support of the components of the light source 10. As can best be seen in FIGS. 4 and 5, the rim 40 provides a series of steps or ledges that support the outer peripheral edge of the protective window 36 and cause the protective window 36 to bear against a horizontal planar surface 64 (FIG. 4) of the first electrode 30. Optionally, as seen in FIG. 4, a pair of gaskets 61, 62 are interposed between an upper surface 36a of the protective window 36 and the horizontal planar surface 64 of the first electrode and a lower surface 36b of the protective window 36 and an upper surface 98 of an inner horizontal portion 42 of the rim 40.

The rim 40 also provides a base for mounting the radiation source 10 to the wafer confining structure 22 as can be seen in FIG. 1. As can best be seen in FIGS. 1 and 2, the first electrode 30 and the annular rim 40 are mounted on an upper surface 23 of the wafer confining structure 22. The annular rim 40 is stepped or offset when viewed in cross section and includes outer and inner horizontal portions 41, 42. The cross section of the rim 40 conforms in size and shape to an offset or stepped peripheral portion of the upper surface 23 of the wafer confining structure 22. The outer horizontal portion 41 of the rim 40 includes a planar upper surface 43 and a plurality of apertures 44. The outer horizontal portion 41 also includes a planar lower surface 45 and similarly the inner horizontal portion 42 includes a planar lower surface 46.

Figure 4:
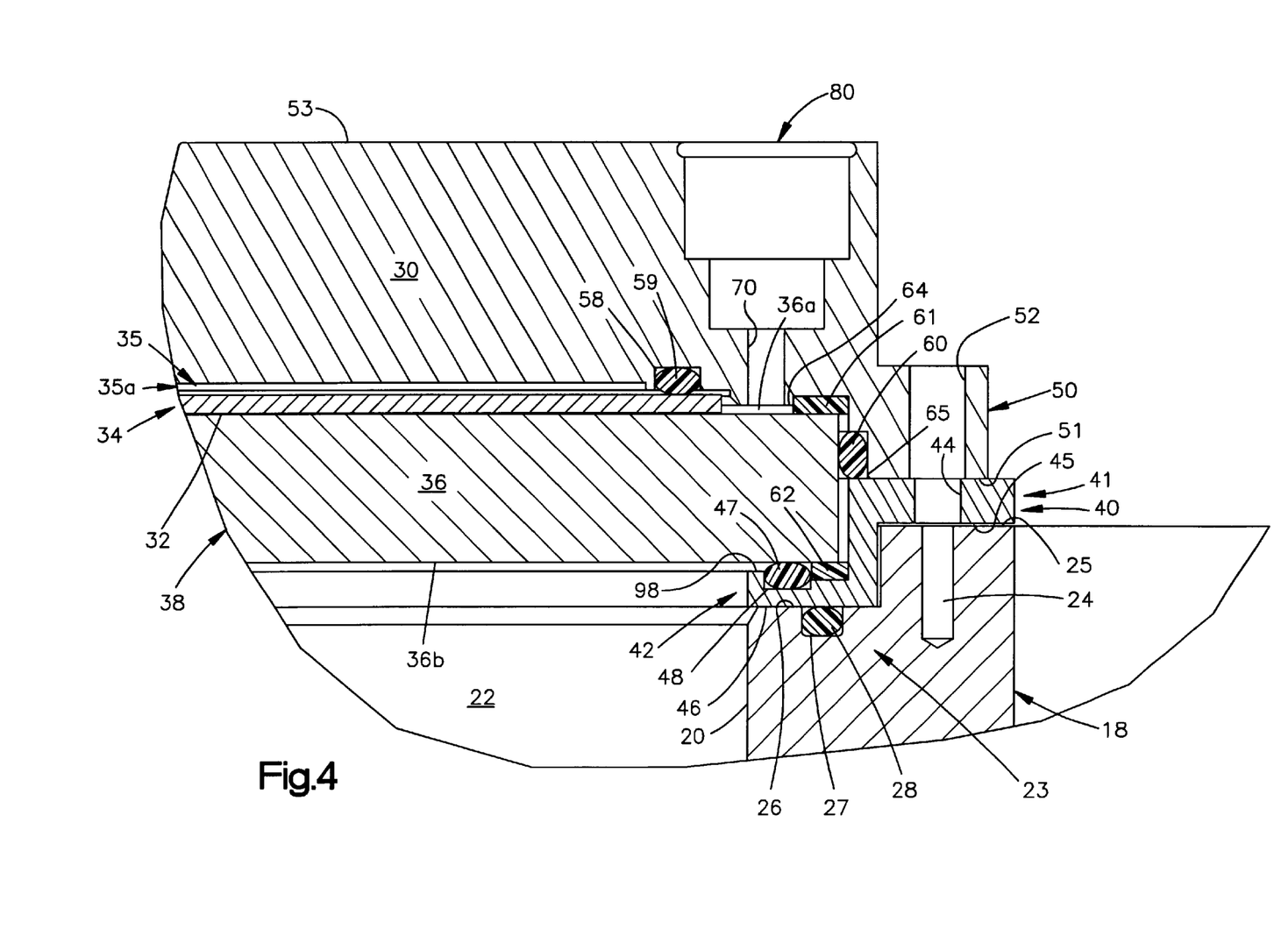
FIG. 4 is an enlarged section view showing a pump port for evacuating region defined between a first or base electrode and a spaced apart dielectric layer.
Figure 5:
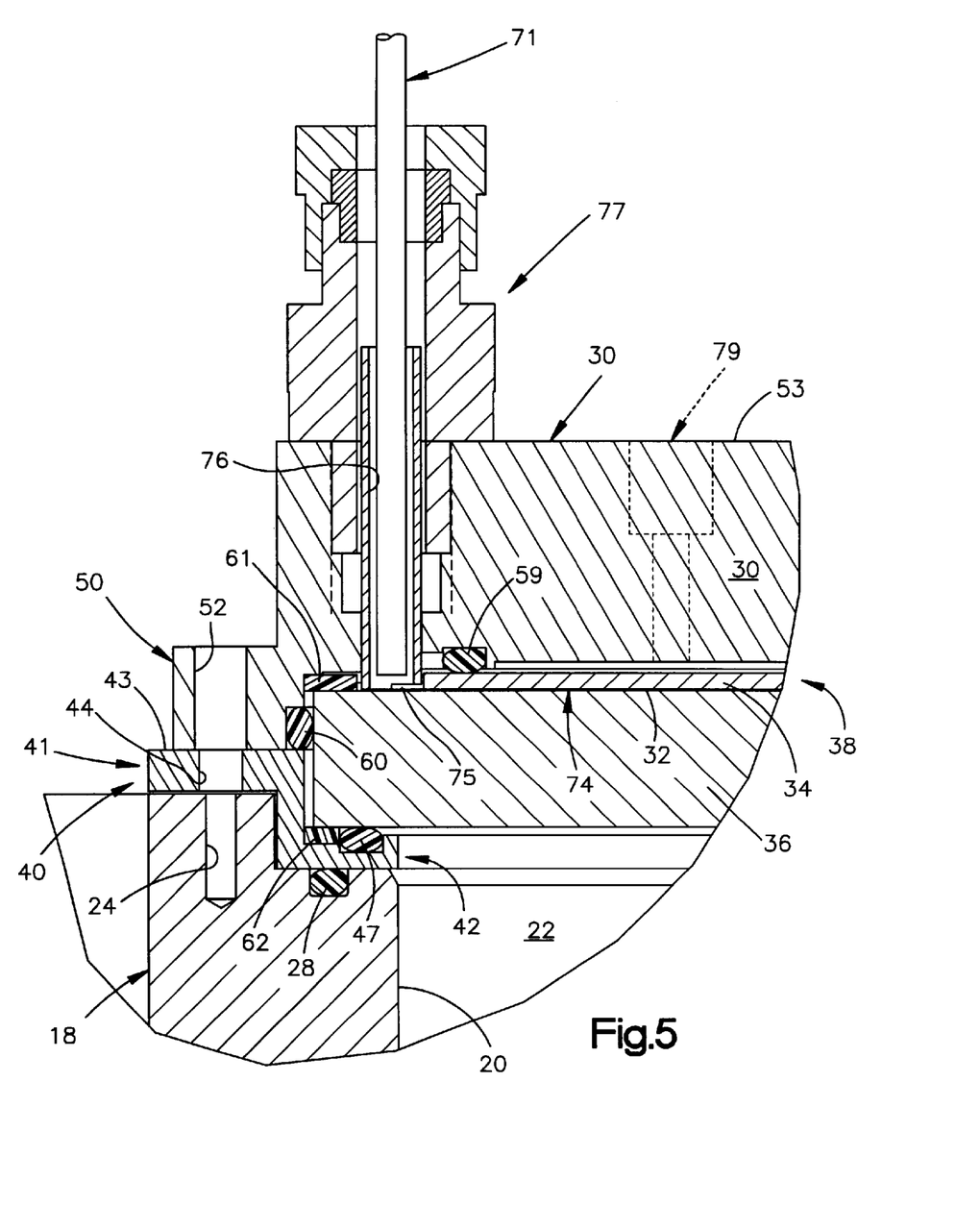
FIG. 5 is an enlarged section view showing an electrical feed which connects a power supply with a second or screen electrode.

As can best be seen in FIG. 4, the first electrode 30 includes a downwardly-stepped peripheral edge portion 50. The peripheral edge portion 50 includes a planar lower surface 51 that is sized to flushly seat on the upper surface 43 of the rim 40. The peripheral edge portion of the first electrode 30 also includes a plurality of apertures 52. The planar lower surface 45 of the rim outer horizontal portion 41 and the planar lower surface 46 of the rim inner horizontal portion 42 are sized to seat flushly against mating stepped horizontal surfaces 25, 26 respectively of the upper surface 23 of the wafer confining structure 22. That is, the lower surface 45 of the rim outer horizontal portion 41 bears against the wafer confining structure horizontal surface 25 while the lower surface 46 of the rim inner horizontal portion 42 bears against the wafer confining structure horizontal surface 26. The first electrode 30 and the rim 40 of the radiation source 10 are mounted on the upper surface 23 of the wafer confining structure 22 using a plurality of bolts (not shown) which extend through the plurality of apertures 52 of the first electrode and through the aligned plurality of apertures 44 of the rim 40 and thread into an aligned plurality of threaded apertures 24 in the upper surface 23 of the wafer confining structure 22 thereby sandwiching the outer horizontal portion 41 of the rim 40 between the peripheral edge portion 50 of the first electrode 30 and the outer horizontal surface 25 of the wafer confining structure 22.

As can best be seen in FIG. 4, the horizontal surface 26 of the wafer confining structure 22 includes a groove or channel 27 which supports an O-ring 28 forming a tight seal between the rim 40 and the wafer confining structure 22. Similarly, a tight seal is formed between the rim 40 and the protective window 36 because of an O-ring 47 seated in a channel 48 formed in the upper surface 98 of the inner horizontal portion 42 of the rim 40.

Depending upon a number of factors including the pressure of the ionizable gas 35a in the region 35, the pressure in the wafer treatment chamber 18, the tensile strengths of the protective window 36 and the dielectric layer 34, it may be necessary to insert one or more reinforcing spacers (three of which are shown schematically at 70 in FIG. 3) in the ionizable gas region 35 to maintain uniformity of spacing between the dielectric layer 34 and the first electrode 30. The plurality of spacers 70 extend horizontally between the base electrode 30 and the dielectric material layer 34 to maintain desired separation. Generally, the use of the spacers 70 is not desirable because such spacers reduce the volume of space available for the ionizable gas 35a and thereby the intensity of emitted radiation. If the protective window 36 is not provided to reinforce and strengthen the dielectric layer 34, the need for spacers, of course, would be increased.

Base Electrode 30

As can best be seen in FIG. 2, the first electrode 30 comprises a generally disk-shaped metallic base electrode. The base electrode 30 is formed of aluminum and is connected to one side of the power supply 33. The base electrode 30 includes an upper surface 53 defining a coolant channel 54 and a pair of O-ring grooves 55a, 55b into which O-rings (not shown) are disposed for sealing purposes.

A cover 56 is mounted to the upper surface via bolts and seals against the O-rings disposed in the grooves 55a, 55b. The region or gap 35 between the base electrode 30 and the dielectric window 38 is occupied by the ionizable, excimer gas 35a, which is excited or energized by the electrodes 30, 32. The gap 35 is nominally a few millimeters thick. The gas 35a trapped in the region 35 emits the UV and VUV light for treating the semiconductor wafer 16 within the chamber 18.

A lower surface 57 of the base electrode 30 has a circular channel 58 into which an O-ring 59 (FIG. 4) is disposed. The O-ring 59 seals against the dielectric layer 34 and thereby seals the ionizing gas region 35. Not shown, but also cut into the electrode 30 are channels to permit ingress and egress of the gas 35a into the ionizing gas region 35 between the base electrode 30 and the dielectric barrier 34. The gas feed and evacuation inlet and outlet 78, 79 and the channels are configured to produce, in the optional case of flowing gas, a uniform flow of gas 35a across the region 35, thereby producing a uniform discharge and uniform light source over the entire two-dimensional area of the light source 10.

Alternatively, the gas region 35 can be simply evacuated, and then filled with the desired gas. Such a non-flowing application is useful for generating radiation using more exotic and expensive gases. Another O-ring 60 (FIG. 4) is disposed between the protective window 36 and a side wall 65 of the first electrode 30. The O-ring 60 serves as a spacer to prevent direct glass to metal contact which can result in chipping or breaking of the protective window 36.

The lower surface 57 of the base electrode 30 advantageously is highly polished so that any radiation from the excited gas (plasma) 35a which is emitted in a general upward direction will be reflected downward and add to the net radiation emission towards the wafer 16. As previously noted, the base electrode 30 includes a gas inlet 78 and a gas outlet 79 providing for entry and exit ports for the ionizing gas 35a confined in the region 35.

As will be explained below, different gases provide for different excimer transitions and, therefore, different emission wavelengths Thus, if it is desired to change the wavelength of emitted radiation, one means of accomplishing this result is to change the composition of the gas 35a in the region 35. This is accomplished by pumping the present gas out of the region 35 though the gas outlet 79 and pumping a desired new gas into the region 35 through the gas inlet 78. A fiber optic light pipe 72 (shown schematically in FIG. 3) extends into the gas region 35 to measure the spectra of the radiation emitted by the excited gas 35a.

It should be understood that while the radiation source 10 shown in FIGS. 1–5 illustrates a generally circular electrode configuration for the base electrode 30 and electrode screen 32, the configuration of the electrodes and the resulting emission pattern could be square, rectangular or any other desired shape.

Dielectric Layer 34

The dielectric window or layer 34 needs to be a good transmitter of VUV wavelength radiation, and, therefore, is preferably fabricate of a high quality quartz. Acceptable dielectric materials include GE214 quartz available from GE Quart, Inc., Willoughby, Ohio, Dynasil quartz available from Dynasil Corp., West Berlin, N.J., or Suprasil quartz available from Heraeus Quarzglas GmbH & Co., Hanan, Germany or Heraeus Amerisil, Inc., Duluth, Ga. A thinner dielectric layer is preferred for optical purposes since it will absorb less emitted radiation. In one exemplary embodiment, a dielectric layer thickness of 0.072 inches (1.8288 mm) proved satisfactory.

Even the best quality dielectric layer 34 will absorb some small amount of emitted radiation, converting it to heat which then needs to be removed Furthermore, this dielectric window 34 needs to be thin enough so as to optimize the discharge which occurs between the dielectric window 34 and base electrode 30 but is driven by the potential between the screen electrode 32 and the base electrode 30.

Protective Window 36

The protective window 36 is not necessary in principle for operation of the radiation source 10 of the present invention, but it provides several advantages. First, the protective window 36 keeps the electrode screen 32 flat, so that the entrapped gas 35a "sees" the same electric potential over the entire two dimensional surface of the screen 32. This, in turn, helps produce uniform irradiance. Second, the protective window 36 excludes air (and oxygen in air) from being in contact with the electrode screen 32, thus preventing any generation of gas discharge or ozone in the vicinity of the electrode screen 32.

Additionally, the protective window 36 provides good thermal contact between the electrode screen 32, the dielectric layer 34 and the protective window 36 so that heat which is generated within the electrode screen area due to ohmic losses can be efficiently removed. Moreover, the protective window 36 is thick enough to provide the strength required to support gas pressures in the radiation source 10 which are significantly above atmospheric pressures. Operation above atmosphere is desirable since the radiation output from the dielectric barrier discharge increases with pressure well into the multi-atmospheric pressure regimes as will be explained in greater detail below. In addition, the protective window 36 helps keep the electrode screen 32 clean. Finally, the protective window 36 provides to some extent a safety barrier between the high voltage electrode screen 32 and other equipment in the vicinity. In a prototype design, several different thicknesses of the protective window 36 were tested, ranging from 0.072 inch to 0.250 inch. The protective window 38 also helps provide the strength to withstand pressure differences between the process chamber 18 and the radiation source 10, e.g., if the process chamber 18 is evacuated.

The protective window 36 also, in conjunction with the dielectric layer 34, defines the "enclosed space" or gap region 74 in which the electrode screen 32 resides, this enclosed space can be evacuated to "bond" the thinner dielectric layer 34 to the thicker protective window 36, thus, reinforcing the dielectric layer 34. The pump port 80 is provided to permit evacuation of the enclosed space between the dielectric layer 34 and the protective window 36.

Electrode Screen 32

The second electrode 32 comprises a semitransparent matrix or mesh screen, preferably about 8 mil. thick. The thin mesh permits radiation emitted by the ionizable gas 35a in the region 35 to travel through the second electrode 32, the radiation-transmissive dielectric layer 34 and the protective window 36 into the treatment chamber 18 to treat the wafer 16. The electrode screen 32 is also circular in shape and has a diameter smaller than the protective window 36 and smallest diameter O-ring, namely O-ring 59, so that electrical discharge is not initiated between the electrode screen 32 and the adjacent metal parts.

The electrode screen 32 is preferably a one-piece grid produced by etching of a single sheet of metal. Tungsten has been used but other metals can be substituted. The electrode screen 32 is produced by etching of a thin metal sheet (0.004 inch thick) and, advantageously, can be etched to very exacting tolerances, with a very narrow wire grid. The dimensions of an electrode screen 32 used in a prototype radiation source 10 are 0.094" cell size, using a square cell grid, with wires of 0.004" width, and 0.004" thickness (vertical dimension). This electrode screen 32 yields a geometric transmission factor of 91.67%. The etched screen has a low profile and a constant thickness (nominally 0.004 inch), even at the intersections of the grid. These features provide several advantages:

Because of the sharp and "clean" edges of the etched screen 32, the etched screen provides arc-initiator sites all along the grid, both at the intersections and away from the intersections. The sharp edges of the etched grid-work allows discharges to initiate anywhere and everywhere based more on the local gas conditions in the chamber than on the details of the construction of the grid. Prior types of screens would have overlying wires creating the grid, thereby having wires at different distances from the base electrode, thereby preferentially offering only a few arc sites in comparison. As a consequence of the multiple arc sites, a highly uniform discharge pattern is created which provides for high uniformity of irradiance.

A tongue or extension 75 (seen in FIG. 2) from the electrode screen 32, or simple extension of the screen, connects the electrode 32 with an electrical feed 71. The electrical feed 71 provides a high voltage coupling between the power supply 33 and the electrode screen 32 and includes an insulating sleeve 76 which traverses a vacuum seal 77. The vacuum seal 77 is mounted on and extends through the base electrode 30. A high voltage, low current, high frequency voltage is applied between the base electrode 30 and the electrode screen 32. The power supply 33 provides pulses at frequencies varying from several kHz up to many MHZ. Required voltages are in the 2–3 kV range and higher.

Such high voltages produce a multitude of short-lived discharges between the electrode screen 32 and the base electrode 30. Because of the emission characteristics of the excimer source gas 35a, most of the UV or VUV radiation is emitted during the initial breakdown of the gas (as will be discussed further below). As a consequence, the power supplied to the radiation source 10 is varied simply by varying the frequency of the pulses supplying current. Therefore, the power supply 33 is preferably a pulsed power supply.

Evacuation of Electrode Screen Gap Region 74

The novel design of the radiation source 10 of present invention allows the thin dielectric material window 34 to sandwich the electrode screen 32 against the protective transmission window 36. A unique dual pumping scheme allows the process chamber 18 to be evacuated and filled without breakage of the thin dielectric window or layer 34. The radiation source 10 also allows hyper-atmospheric operation, which advantageously results in increased radiation output.

There were several design requirements for the radiation source 10 that make engineering difficult. One requirement was that the thickness of the dielectric layer 34 between the electrode screen 32 and the ionizable gas 35a be relatively thin. This is for electrical (and, therefore, light emission) performance reasons. As a result, problems occur when one wants to evacuate the region in which the discharge gas will be introduced. Namely, the atmospheric pressure difference across the dielectric layer 34 may break it, especially for large area radiation sources needed for treatments of 300 mm. diameter wafers.

Another requirement that caused difficulty was that both the dielectric layer 34 and the protective window 36 must be made of materials which are transmissive in the VUV range of wavelengths. This constraint eliminates some otherwise permissible solutions to the issues above. Namely, one cannot cement or glue the electrode screen 32 between dielectric layer 34 and the protective window 36, thus making one solid piece capable of withstanding one or more atmospheres of pressure.

There are a number of instances in which the dielectric layer 34 and protective window 36 would experience pressure differences of one atmosphere or more, either transiently, or during regular operation of the semiconductor wafer treatment system 14:

1) If one needs to operate at several atmospheres of gas pressure inside the light source 10, which is desirable in some applications;
2) If one wishes to evacuate the process chamber 18, either momentarily or during the entire process.
3) If one wants to change or purge gases in the light source gas region 35, one would momentarily evacuate the light source gas region 35. Furthermore, any two or more of these procedures might be done simultaneously, thus creating multi-atmospheric pressure differences across the dielectric layer and the protective window.

The cement or glue would absorb VUV light. Also, one cannot embed the electrode screen 32 into a single window (thus eliminating the need for two distinct windows) during the fabrication process of the window since the fabrication process is already difficult enough for these specialized materials (e.g, VUV grade quartz, sapphire, $CaF_2$, $MgF_2$).

The radiation source 10 of the present invention addresses the above-noted problems. The relative diameters of the dielectric layer 34 and the protective window 36 are chosen so that there can be two evacuable regions, the first region 35 is the normal volume in which the dielectric barrier discharge occurs, that is, the region between the base electrode 30 and the dielectric layer 34 The second region 74 (shown schematically in FIG. 3) is defined by the gap between the dielectric layer 34 and the protective window 36 in which the electrode screen 34 is disposed. As can best be seen in FIG. 4, the dielectric layer 34 and the protective window 36 are sealed with appropriate O-rings 59, 60 and, optionally, gaskets 61, 62 so that the gap region 74 housing the electrode screen 32 can be differentially pumped.

By evacuating the gap region 74, the dielectric layer 34 and the protective window 36 are forced together, sandwiching the electrode screen 32 therebetween. Importantly, this sandwiching of the electrode screen 32 makes the dielectric layer 32 become part of a much thicker window assembly 38 (the assembly 38 includes the protective window 36, the dielectric layer 34 and the electrode screen 32), so that subsequent pumping of the excimer gas 35a into the region 35 on the other side of the dielectric layer 34 will not cause the thin dielectric layer 34 to flex and break.

The volume or gap region 74 between the dielectric layer 34 and the protective window 36 is evacuated so that a maximum of one atmosphere holds the dielectric layer 34 and the protective window 36 together. The gas discharge volume of the gas ionizing region 35 can be evacuated to any pressure (up to 1 negative atmosphere) without jeopardizing the dielectric layer 34. Conversely, the gas discharge volume of the gas ionizing region 35 can be pressured to any pressure, even above atmosphere, without jeopardizing the mechanical integrity of the assembly 38, limited only by the pressure stand-off capability of the assembly 38 comprising the dielectric layer 34 and the protective window 36.

The vacuum obtained in the region 74 between the dielectric layer 34 and the protective window 36 does not need to be of a "high vacuum" quality. That is, one does not need specialized vacuum equipment capable of a vacuum of $10^{-7}$ torr; instead, a vacuum of several torr would be adequate since the gas ionizing region 35 would not be capable of being pumped enough beyond this value to stress the dielectric layer 34.

In spite of the engineering difficulties noted above, there are other design possibilities for the protective window—electrode screen—dielectric layer assembly 38 apparent to one skilled in the art. As one example, the screen 32 could be impregnated within the space between the two quartz windows (dielectric layer 34 and protective window 36) to remove all gas from within the gap 74 between the protective window 36 and the dielectric layer 34 and to provide even better thermal contact. The impregnating material must, of course, be transparent or semi-transparent to UV and VUV radiation. As another example, the gap 74 within which the electrode screen 34 is disposed may be sealed and filled with some gas to either exclude oxygen, prevent breakdown of the gas, or both. As a third example, the electrode screen 32 may be built into the dielectric layer quartz during the formation of the quartz.

Gas Discharge Process

This above described equipment and operation provide the conditions necessary for an excimer transition to be preferentially excited when a gas or gas mixture is used which has an excimer type energy transition: 1) low gas temperature, 2) high excitation energy.

During a single pulse, when sufficient electric field is applied across the gas gap of the region 35 so that the ionization rate exceeds the electron attachment rate, a streamer forms, transporting charge across the gap, and depositing charge on the surface of the dielectric layer 34. Without the presence of the dielectric layer 34, the initial discharge, starting in the Townsend pattern, would develop into one thermal arc. Instead, the accumulating and/or depletion of electrons on/from the dielectric layer 34 quickly reduces the internal, local electric field to the point where attachment dominates ionization and the streamer extinguishes itself.

The whole process of formation and extinction occurs within a few nanoseconds, providing a non-thermal plasma (no time for collisionality to equilibrate the heat between the electrons and the atoms/ions) even at high pressures (100 mbar to several atmospheres).

While each individual micro-discharge described above occurs in a small "channel" ($\approx$100 microns in diameter), a large number of these (for each applied pulse from the power supply) distributed over the entire surface of the electrodes 30, 32 give the source 10 a uniform illumination intensity appearance. These micro-discharges are fairly independent of each other. Nevertheless, it is important to provide electrodes which encourage as many micro-discharges to occur as possible and to have these micro-discharges form as uniformly as possible over the surface of the radiation source 10.

Most of the UV or VUV radiation is emitted during the break-down of the micro-discharge, and hence lasts only a few nanoseconds. Thus, there is no need to prolong each micro-discharge. For this reason, a pulsed power supply is utilized Because of the above described operating behavior (high efficiency excimer transitions, high voltage, low current, high pressure), these sources operate at low equipment temperatures resulting in a relatively cool radiation source 10.

Examples of Suitable Excimer Ionizable Gases 35*a*

There are a number of acceptable ionizable gases which produce emissions in the UV and VUV wavelength range during excimer excitation. This provides for an essentially continuous (but discrete) range of selectable peak wavelengths in the UV and VUV portions of the spectrum, the peak wavelength selected depending only on the ionizable gas 35 used in the radiation source 10. For example, acceptable ionizing gases and their associated peak wavelengths include the following:

TABLE 1

| Excimer Gas | Peak Wavelength |
|---|---|
| NeF | 108 |
| $Ar_2$ | 129 |
| $Kr_2$ | 147 |
| $F_2$ | 158 |
| $Xe_2$ | 172 |
| ArCl | 175 |
| KrI | 185 |
| ArF | 193 |
| KrBr | 206 |
| KrCl | 222 |
| KrF | 249 |
| XeI | 253 |
| $Cl_2$ | 258 |
| XeBr | 282 |
| $Br_2$ | 290 |

A prototype of the radiation source 10 has been operated successfully with both pure $Xe_2$ (for 172 nm. excimer transition) (see FIG. 6) and with $Ar/CF_4$ (for 193 nm. ArF excimer transition) (see FIG. 7).

Figure 6:
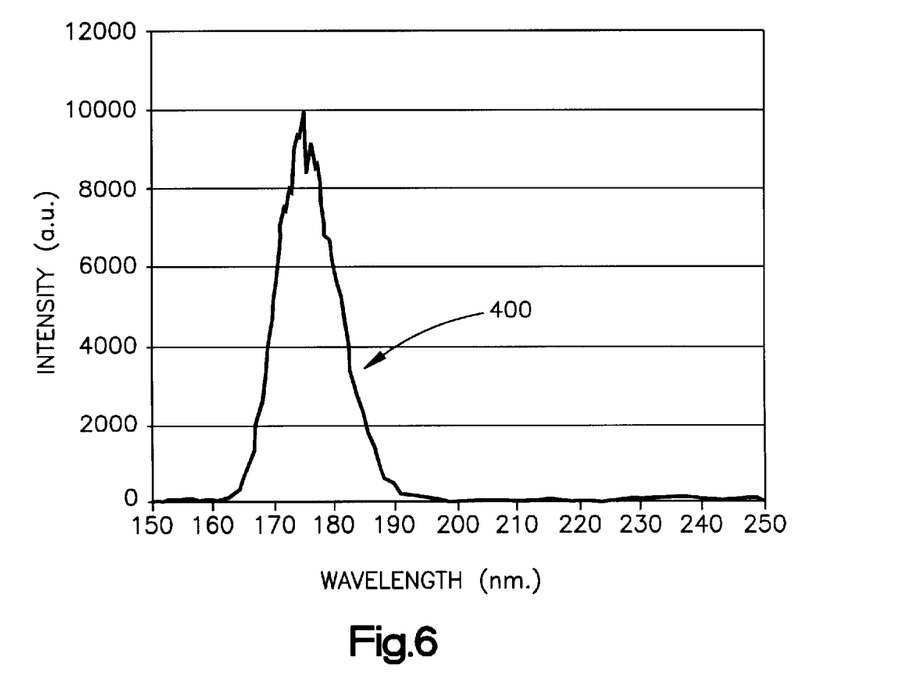
FIG. 6 is a graph showing radiation intensity as a function of wavelength for a Xe excimer gas source.

FIG. 6 shows the emission spectrum for the $Xe_2$ at 600 torr operation. As can be seen, the emission spectrum is centered at approximately 172 nm. with a FWHM bandwidth of approximately 14 nm. A prototype Xe radiation source yielded 0.3 mW/cm$^2$ irradiance. As would be recognized by one skilled in the art, the prototype radiation source output intensity could be increase by various modifications including improved dielectric layer, protective window and electrode screen materials, improved power supply, use of higher pressure in the ionization region 35, elimination of air from gap region 74.

This prototype output intensity compares with 5.5 mW/cm$^2$ available from presently available radiation sources at 172 nm. using arrays of linear bulbs. The consequences (and disadvantages) of using linear bulbs include the following:

1. The uniformity of the light over the light source is very poor for arrays of linear lamps and is typically +/− 15%. This is due to the discrete nature of the lamps.
2. The output irradiance is limited due to the limited volume of emitting gas. There is an optimum discharge energy density for producing excimer light. Therefore, the volume of the discharge will then limit the net intensity of the light output.

The volume of the working gas (i.e., the gas 35*a* present at any given time in the ionizable gas region 35) for the radiation source 10 of the present invention is uniform, thereby yielding uniformity in illumination on the order of a few percent. The volume of the working gas for the present invention is maximized by having a two dimensional "slab" of excited gas 35*a* between the two planar electrodes, thus yielding a much higher output than that of the linear lamp array configuration. The high transmission electrode screen 32 allows this to work efficiently.

Figure 7:
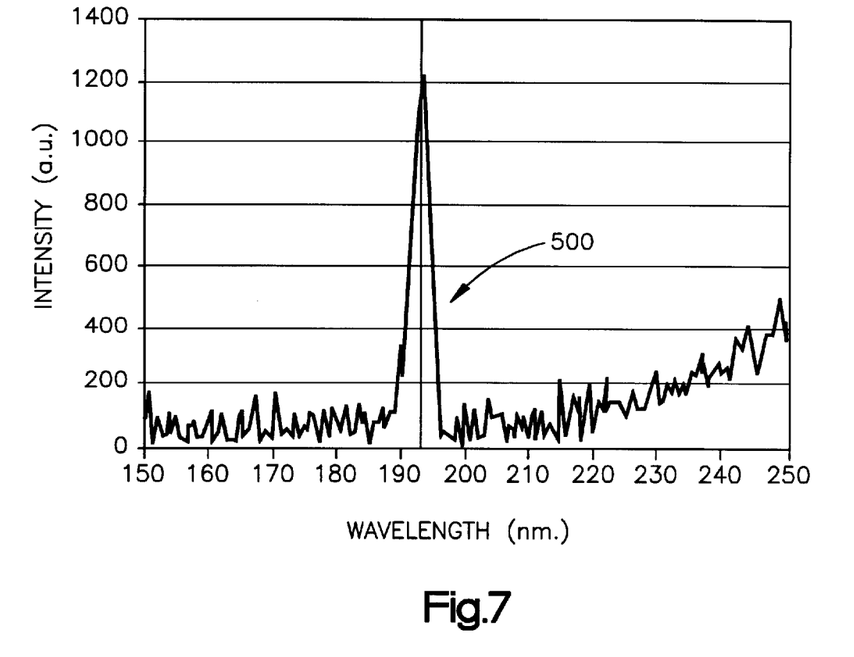
FIG. 7 is a graph showing radiation intensity as a function of wavelength for a Ar/CF$_4$ excimer gas source.

FIG. 7 shows the emission spectrum for 193 nm. ArF excimer emission labeled as 500. The $CF_4$ was used to convey the fluorine since it is relatively innocuous test gas mixture and was readily available. However, $CF_4$ is not optimum for the excimer physics or the light output. However, since such a small percentage of fluorine is needed in the gas mixture, there are only small safety issues which need to be addressed in order to safely operate with an Ar/F mixture.

Irradiance Uniformity

The radiation source 10 advantageously produces high uniformity of irradiance. The dielectric-screen-window assembly 38 "sandwich" provides for a "slab" of excited gas 35a with no built-in non-uniformities. The design of the radiation source 10 is markedly different from that of point sources or linear lamp sources which have fundamental non-uniformities when incorporated into a system design. Each separate linear lamp acts as a "quasi-point source", or line source, so that the intensity drops off quickly as one moves away from any one lamp. Once one is far enough away, the uniformity improves, but the intensity has suffered.

On the other hand, the "flat-panel" character of the radiation source 10 of the present source invention provides what appears to be an infinite plane of multiple point sources closely spaced, so that the intensity falls off slowly (linearly) with distance from the source (see below) as opposed to inverse-squared with distance as for a point source. Secondly, high uniformity of irradiance is achieved by use of a special screen construction for the electrode screen 32 explained above.

Wavelength Tuning

Wavelength tuning is achieved by two methods. "Course tuning" is discrete in nature and is accomplished by changing gases/gas-mixtures within the ionizing gas region 35 of the radiation source 10. Preferably, changing gas 35a is accomplished by pumping an existing gas out of the region 35 through the gas outlet 79 and pumping a new gas into the region through the gas inlet 78. Since the gases in this region 35 will over long enough times become contaminated, radiation output may decline With a feedback detection method to monitor the radiation output (e.g., the fiber optic light pipe 72, shown schematically in FIG. 3), a threshold level could be specified past which the "old" gas is evacuated and "new" gas is introduced into the region 35. As another option, one can have different radiation sources which are charged with different gas mixtures. These could be permanently sealed if desired, and one would only exchange these radiation sources (by mounting a selected one of the radiation sources to the wafer confining structure 22) as necessary to produce a desired emission output range of wavelengths.

A high output intensity is in part obtained by configuring the emission volume or region 35 into a relatively large, planar two dimensional volume. Because there is an optimum gap spacing, the width of the region 35 is fixed. The high intensity of UV and VUV radiation produced is obtained by not having a point or line radiation source, but by having a planar "flat-panel" source. The volume of the region 35 is more than an order of magnitude greater than the volume normally used in typical linear lamps.

Advantageously, the high output intensity is in part obtained by the highly transparent nature of the electrode screen 32. As noted above the electrode screen 32 yields a geometric transmission factor of 91.67% This is an unusually high transmission factor compared to typical prior art electrode screens. Typical electrode screens have transmission projected geometric transmission factors ranging from 40% up to 60 or 70%. Beyond the higher "projected" geometric transmission factor compared to typical screen wire construction, the electrode screen 32 is relatively more transmissive than prior art electrode screens due to its extremely low vertical profile. That is, very little radiation that comes from the gas region 35 at high angles is lost due to interception by the finite thickness of the electrode screen 32 since the thickness is so small.

Figure 11:
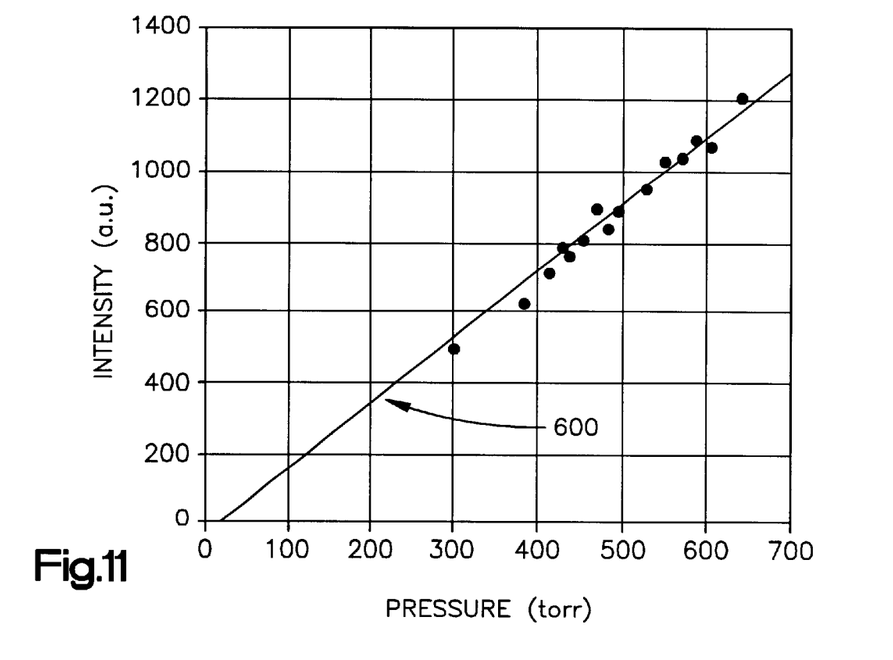
FIG. 11 is a graph showing a linear dependence between gas pressure and radiation intensity.

A high output intensity of the radiation source 10 is also in part obtained by use of high pressure. Because of the short-lived micro-discharges, the gas 35a does not thermalize with the high temperature micro-discharge. As a consequence, the gas pressure in the region 35 can be raised with the result that there are more emitters to produce more radiation output. In fact, the radiation output intensity increases linearly with an increase in gas pressure in the region 35. This is illustrated by the graph labeled 600 in FIG. 11. As FIG. 11 shows, the linear dependence between radiation output and gas pressure is extremely linear from several hundred torr to over 600 torr. This dependence is expected to continue up to several atmospheres.

Note that the pressure during excitation of the gas 35a is nearly the same as that with the excitation off. This further supports the fact that the average gas temperature does not rise due to the many micro-discharges occurring at high frequencies. The results shown in FIG. 11 are for Xe excimer gas operation but similar linear dependencies are obtained for other gas mixtures for excimer operation of the radiation source 10.

Atmospheric or Super-Atmospheric Pressure Operation

Atmospheric or near atmospheric operation has several auxiliary (beyond high intensity) advantages over low pressure or below atmospheric operation of the radiation source 10. Since there is a relatively large window area provided by the protective window 36, and since one wishes to minimize the required spacers and area occupied by spacers, if spacers are used in the area between the base electrode 30 and the dielectric layer—electrode screen—protective window assembly 38, operation at atmospheric or near-atmospheric pressure minimizes the pressure stresses on the system and minimizes the likelihood of quartz breakage, thereby minimizing the need for supporting spacers.

Furthermore, above-atmospheric operation has advantages over sub-atmospheric operation. Again, this type of operation has advantages for maximizing the radiation output. Since the protective quartz window 36 can be much thicker than the dielectric layer 34, the assembly 38 can be easily designed to withstand the outward pressures due to an over-atmospheric fill of gas in the radiation source 10 This is as opposed to having to support the assembly 38 from implosion due to very low pressure or sub-atmospheric operation.

High pressure operation provides better heat conduction from the discharge region to the actively cooled base electrode 30. The low-profile design of the wire mesh electrode screen 32 has auxiliary benefits. Since the electrode screen 32 intercepts less radiation, it heats up less and thereby reduces the overall cooling requirements on the radiation source 10. Wire-constructed screens of the prior art typically had over-lapping wires in contact with each other. These features favor arc development between the sections of the screen, thereby wasting power and unnecessarily heating the screen assembly. Furthermore, unless special efforts are made to exclude oxygen or air from this region, undesirable ozone could be generated in the gap region in which the electrode screen is disposed. Ozone and oxygen in air, will absorb radiation below 250 and 200 nm. respectively, thereby defeating the purpose of VUV light source operation.

In prior art radiation sources designed for wafer treatment, strict requirements were usually placed on the wafer location relative to the radiation source. This stems from two problems:

1) If the uniformity of the irradiance is poor, as is often the case with sources using linear lamps, then there is an optimum location of the wafer relative to the source; this location is usually very close or nearly touching the source since the intensity of light falls off as one moves away from line sources. For example, for a point source, which is an extreme case, the light intensity falls off as $1/r^2$.

2) Due to the absorption of air, radiation from sources with wavelengths far into the VUV spectrum will be absorbed by the air between the source and target wafer. This required the wafer to be placed close to the surface of the light source.

Figure 10:
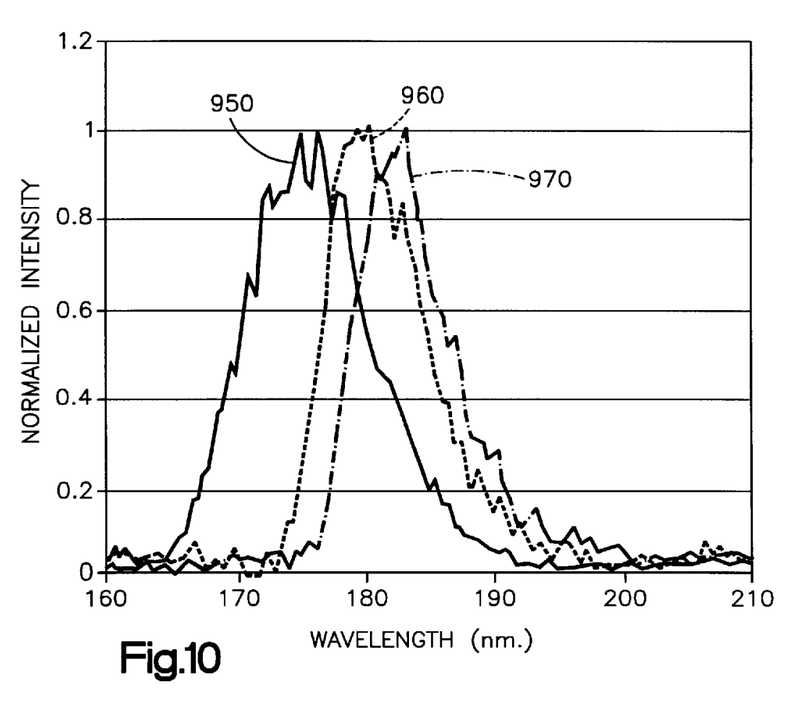
FIG. 10 is a graph of wavelength versus intensity for a variable frequency source.
Figure 12:
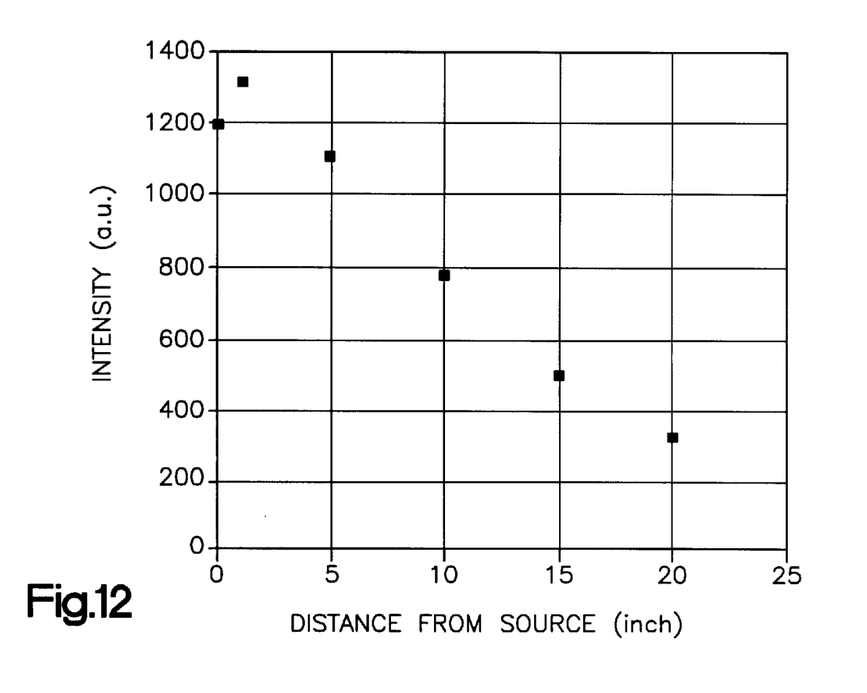
FIG. 12 is a graph showing a linear dependency between distance from the radiation source and the radiation intensity.

The light source 10 of the present invention solves these two problems. Because of the singular, planar nature of the ionizable gas region 35, the intensity of emitted radiation falls off linearly with distance from the source surface (when avoiding air absorption issues). In fact, the linear fall-off is very slow, especially when compared to the $1/r^2$ fall-off characteristic of a point source. FIG. 12 shows the radiation intensity as a function of distance from the surface of the radiation source 10, extending as far as 20 inches from the source. In this case, the ionizing gas 35a was ArF with a 193 nm. excimer transition. At this relatively high VUV wavelength, the oxygen absorption is relatively low. Nevertheless, a small component of the fall-off shown in FIG. 10 is due to oxygen absorption due to the air between the source 10 and a target detector. For lower wavelengths, such as 172 nm from the Xe excimer transition, one would have to purge any air between the source 10 and the wafer 16. As can be seen in FIG. 12, for a distance as far as 10 inches, the radiation intensity has fallen off by less than 50%. This is due to the fact that as one moves away from the source 10, the light intensity from points closest to the detection point falls off, but the detection point can now view many more areas of the source, and views them at an increasingly perpendicular angle, thereby further adding to the detected intensity.

Figure 13:
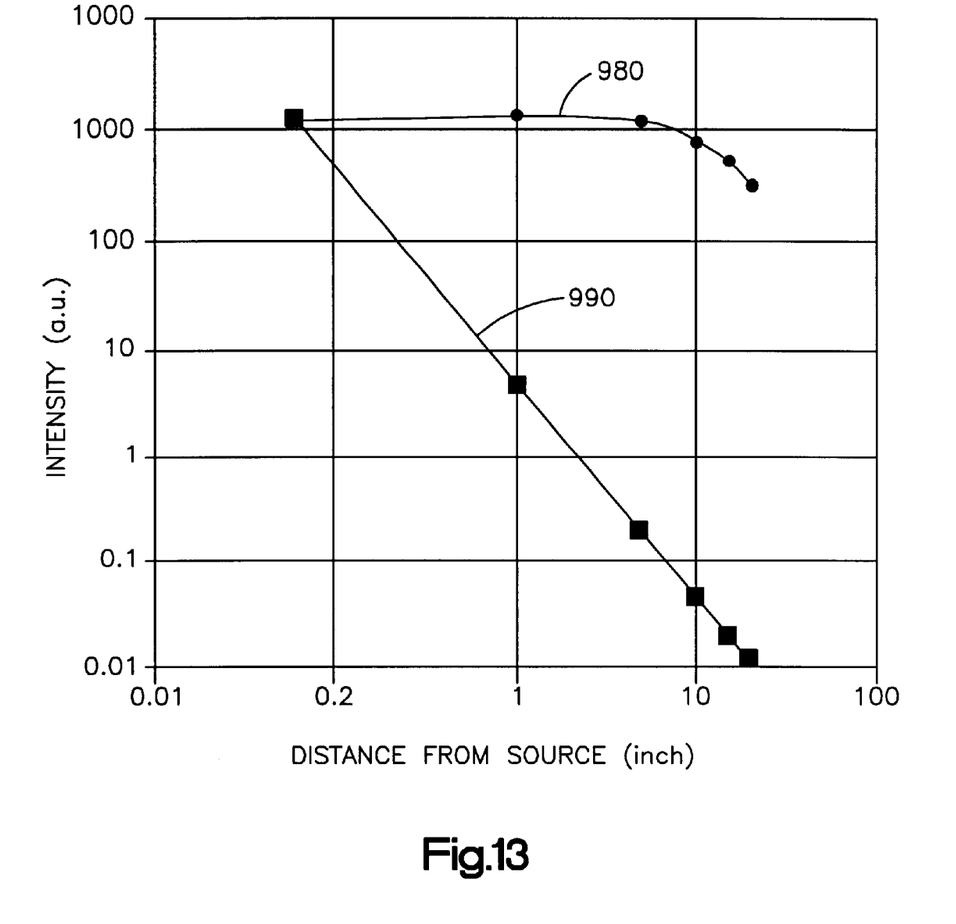
FIG. 13 is a logarithmic scale graph showing radiation intensity as a function of distance from a light source for a point source of light and for the radiation source of the present invention.

FIG. 13 shows the same data as shown in FIG. 12, but the data is plotted on a log-log scale so that the $1/r^2$ dependence of the radiation intensity of a point source can also be added for comparison purposes. The intensity of the light source 10 is labeled 980 while the intensity of a radiation point source is labeled 990. As can be seen in FIG. 13, there is a dramatic difference between the radiation source 10 of the present invention and the fall-off due to a point source.

It should be noted that some of the fall-off at large distances from the radiation source 10 in FIGS. 10 and 11 is due to the finite-size of the prototype radiation source configuration (only several square inches for the case of these two particular FIGS. 12 and 13). Even so, the intensity stays strong for a much larger distance than one would think. This is probably-due to the fact that much of the emission from this prototype radiation source is coming off nearly perpendicular to the source surface.

For wavelengths low enough for any undesirable oxygen (in air) absorption to be a problem, the gas absorption filter chamber 190 (discussed below in connection with the second preferred embodiment 10') can be used to purge any air or oxygen from the path of the emission simply by filling the filter chamber 190 with a gas such as nitrogen, so that it acts as an "anti-filter" or, alternatively, some other means can be used to purge the air.

Second Preferred Embodiment of Radiation Source

Figure 8:
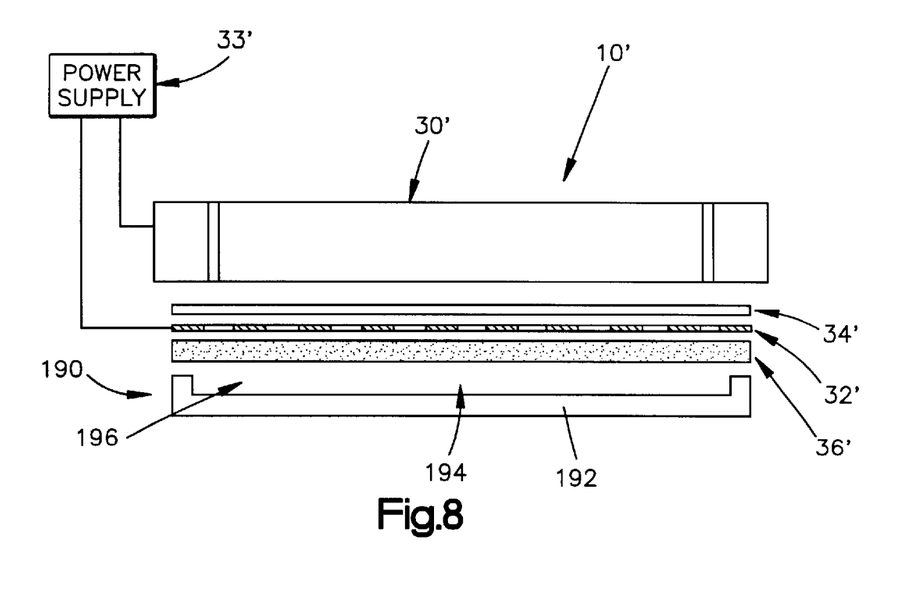
FIG. 8 is a schematic sectional depiction of a second embodiment of the radiation source of the present invention including a filter for filtering light emitted from a radiation generation region.

A second preferred embodiment of the radiation source of the present invention is shown schematically at 10' in FIG. 8. Advantageously, the radiation source 10' permits "fine tuning" of the wavelengths of the emitted radiation through the use of a gas filter 190. The remaining structure of the radiation source 10' is similar to the configuration described with respect to the radiation source 10 described in the first preferred embodiment and will not be repeated. Elements labeled 30', 32', 33', 34' and 36' correspond in structure and function to the corresponding elements 30, 32, 33, 34 and 36 in the radiation source 10 discussed above. The low profile, continuously adjustable, gas filter 190 preferentially filters out unwanted wavelengths emitted by the source 10' while not impacting desired wavelengths.

The filter 190 is constructed using a radiation transmissive member 192 disposed below and spaced from the protective window 36' to define a filter chamber or region 194 into which an appropriate absorber gas 196 is injected. This filtering capability is important in the processing of semiconductor wafers. High energy photons are important for some processes. However, if the photon energy exceeds some critical value, the photons may actually cause damage to the semiconductor wafer circuits (by, for example, electron-hole pair generation).

Given a standard, relatively wide, excimer band, one may want only the lower energy portion (or upper wavelength portion) of the band. Consequently, one can "surgically" remove the high energy "tail" with an absorber gas 196 comprising oxygen or air (air being 18% oxygen). The benefits of gas filtering, as opposed to other types of filtering, is that the desired wavelengths are only slightly diminished in amplitude, especially when sharp differential filtering is employed. The filter chamber 194 utilizes the emission absorption characteristics of the absorber gas 196. The absorption spectrum of oxygen, for example, shows a complicated structure but basically is increasing very rapidly toward lower wavelengths, as is shown at 900 in FIG. 9.

Figure 9:
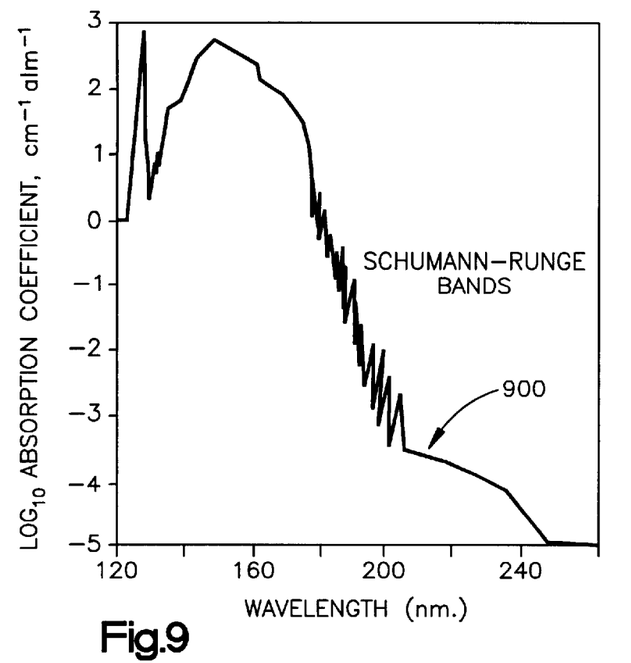
FIG. 9 is a graph showing absorption coefficient versus wavelength for an oxygen gas filter.

One feature which makes the oxygen absorption spectrum so attractive for the radiation source 10' of present invention is that it spans eight orders of magnitude between wavelengths of 240 nm and 150 nm as can be seen in FIG. 9 This means that it is a very strong differential filter and also that it covers the range of UV and particularly VUV wavelengths which the present invention is specifically interested in. In particular, oxygen offers differential filtering for the VUV wavelengths from 150 to 200 nm.

By filling the filter chamber 194 with an adjustable pressure of oxygen, one can introduce a specific lower cut-off wavelength which acts as a very sharp high-pass filter (for wavelengths). The bandwidth of a typical excimer transition is large due to the continuum nature of the transition (from vibrational motion of the interatomic distance between the atoms comprising the excimer molecules). Given the relatively wide bandwidth of a typical excimer transition, the gas filter 190 can selectively narrow that band, and in so doing, move the peak wavelength upward in wavelength. The peak amplitude of the band, of course, diminishes, but only slowly since the bandwidths are so large to begin with.

As an example, the Xe gas exhibited an excimer transition with a peak at 172 nm. (shown in FIG. 6 at 400). This emission band has a FWHM of approximately 18 nm., resulting in significant emission radiation extending all the way from 163 nm. to 181 nm. If it is found that radiation at or below 165 nm. is undesirable, then the gas filter 190 can remove this low wavelength component without significantly affecting the longer wavelength radiation levels.

FIG. 10 shows an example of the application of the air based gas filter 190 to an Xe 172 nm. excimer source. In the graph labeled 950, the filter 190 included a 1/16 inch gap between the protective window 36' and the filter window 192. The peak emission wavelength shifted to about 175 nm. which is a slight increase from the unfiltered 172 nm. peak. In the graph labeled 960, the filter 190 was modified to have a 0.5 inch gap between the protective window 36' and the filter window 192. The peak emission wavelength shifted to about 180 nm. compared to the unfiltered 172 nm. peak. Finally, in the graph labeled 970, the filter 190 was modified to have a 1.25 inch gap between the protective window 36' and the filter window 192. The peak emission wavelength shifted to about 183 nm. compared to the unfiltered 172 nm. peak.

In FIG. 10, the peak emission is shifted from 172 nm. to 183 nm., but much higher shifts (additional 10 nm.) are possible. In fact, the peak can be shifted up to nearly 190 nm, after which a different excimer transition (namely, the ArF 193 nm. excimer transition) can be utilized in place of Xe. This yields, as an example, a continuously selectable peak wavelength from 172 nm. to 200 nm. with just two different gas mixtures/excimer transitions, namely Xe and ArF. One can see from the three filtered cases in FIG. 10 that the lower wavelength cut-off is very sharp, taking only about 8 nm. to completely cut off the emission.

While the present invention has been described with a degree of particularity, it is the intent that the invention include all modifications and alterations from the disclosed embodiments falling within the spirit or scope of the appended claims.

What is claimed is:

1. A radiation source for emitting radiation for use in processing semiconductor wafers, the radiation source comprising:
   a) a base electrode having a two dimensional surface bounding a radiation emitting region;
   b) a radiation transmissive dielectric member that bounds the radiation emitting region spaced from the base electrode by the radiation emitting region for transmitting radiation from the radiation emitting region to a wafer treatment region;
   c) a two dimensional radiation transmissive matrix electrode that is in contact with the transmissive member in a plane generally parallel to the two dimensional surface of the base electrode that bounds the radiation emitting region;
   d) a power supply for energizing the base and matrix electrodes;
   e) a gas supply for delivering an ionizable gas to the radiation emitting region for ionization by a field set up between the base and matrix electrodes; and
   f) the power supply energizing the base electrode and the matrix electrode to generate an electrical field resulting in excimer excitation of the ionizable gas in the radiation emitting region thereby generating a planar pattern of radiation emitted from the source exiting the source though the matrix electrode.

2. The radiation source of claim 1 additionally including a radiation transmissive protective window which contacts the matrix electrode and holds it in contact with the dielectric member that bounds the radiation emitting region, the planar pattern of radiation emitted from the source exiting the source though the protective window.

3. The radiation source of claim 1 additionally comprising one or more spacer elements disposed in the radiation emitting region, the spacer element disposed between the dielectric member and the two dimensional surface of the base electrode that bounds the radiation emitting region.

4. The radiation source of claim 1 wherein the gas supply routes a selected one of group of ionizable gases capable of excimer excitation to the radiation emitting region to achieve a desired range of wavelengths of radiation emitted by the source.

5. The radiation source of claim 4 wherein the group of ionizable gases includes: NeF, $Ar_2$, $Kr_2$, $F_2$, $Xe_2$, ArCl, KrI, ArF, KrBr, KrCl, KrF, XeI, $Cl_2$, XeBr, $Br_2$, and $Ar/CF_4$.

6. The radiation source of claim 1 wherein the gas supply is routed to the radiation emitting region though spaced apart entry and exit ports in the base electrode.

7. The radiation source of claim 2 wherein the radiation transmissive protective window is urged against the matrix electrode and functions to reinforce the dielectric member as a result of evacuating a gap region between the protective window and the dielectric member resulting in a negative pressure condition causing the protective window and dielectric member to tightly sandwich the matrix electrode.

8. The radiation source of claim 1 wherein the matrix electrode is a conductive mesh material.

9. The radiation source of claim 1 additionally including a radiation transmissive filter chamber member spaced apart from the radiation transmissive protective window to define a filter chamber and an absorber gas injected into the filter chamber to absorb certain wavelengths of radiation emitted from radiation emitting region such that a reduced range of radiation wavelengths is emitted from the radiation source through the radiation transmissive filter chamber member.

10. The radiation source of claim 9 wherein the absorber gas includes oxygen.

11. The radiation source of claim 1 wherein the emitted radiation is in the UV wavelength range.

12. The radiation source of claim 1 wherein the emitted radiation is in the VUV wavelength range.

13. A method of treating a semiconductor wafer disposed in a radiation treatment chamber through radiation treatment of said wafer, the steps of the method comprising:
    a) positioning a first electrode having a generally planar surface facing a radiation emitting region;
    b) positioning a dielectric radiation transmissive member spaced apart from and generally parallel to the generally planar surface of the first electrode, a first side of the dielectric member bounding the radiation emitting region and a second side of the dielectric member facing the wafer;
    c) positioning a two dimensional radiation transmissive electrode screen adjacent the second side of the dielectric member in a plane generally parallel to the two dimensional surface of the base electrode that bounds the radiation emitting region;
    d) providing an ionizable gas capable of excimer excitation in the radiation emitting region; and
    e) energizing the base electrode and the electrode screen to generate an electric field between the base electrode and electrode screen and cause excimer excitation of the ionizable gas thereby generating a planar pattern of radiation emitted from the source to treat the wafer.

14. The method of claim 13 wherein the step of energizing the base electrode and electrode screen includes energizing with pulsed voltage having a frequency of greater than 1 Kilohertz.

15. The method of claim 13 wherein the step of providing an ionizable gas includes providing a gas inlet and gas outlet in the base electrode in communication with the radiation emitting region to inject the ionizable gas into the radiation emitting region.

16. The method of claim 13 wherein the step of providing an ionizable gas includes the substep of selecting an ionizable gas from a group of ionizable gases including the following: NeF, $Ar_2$, $Kr_2$, $F_2$, $Xe_2$, ArCl, KrI, ArF, KrBr, KrCl, KrF, XeI, $Cl_2$, XeBr, $Br_2$, and $Ar/CF_4$ and injecting the selected ionizable gas into the radiation emitting region.

17. The method of claim 13 additionally including the step of providing a radiation transmissive protective window which contacts the electrode screen and holds it in contact with the dielectric member that bounds the radiation emitting region, the planar pattern of radiation emitted from the source exiting the source though the second radiation transmissive member.

18. A radiation source for emitting radiation for treatment of a semiconductor wafer disposed in a wafer confining structure, the radiation source comprising:
   a) a base electrode having a two dimensional surface bounding a radiation emitting region;
   b) an assembly including:
      1) a radiation transmissive dielectric member bounding the radiation emitting region and spaced from the base electrode by the radiation emitting region for transmitting radiation from the radiation emitting region to a wafer treatment region; and
      2) a two dimensional, radiation transmissive matrix electrode in contact with the transmissive member in a plane generally parallel to the two dimensional surface of the base electrode that bounds the radiation emitting region;
   c) a power supply for energizing the base and matrix electrodes;
   d) an ionizable gas capable of excimer excitation disposed to the radiation emitting region for ionization by a field set up between the base and matrix electrodes; and
   e) the power supply energizing the base electrode and the matrix electrode to generate an electrical field resulting in excimer excitation of the ionizable gas in the radiation emitting region thereby generating a planar pattern of radiation emitted from the source exiting the source though the matrix electrode.

19. The radiation source of claim 18 wherein the assembly additionally including a radiation transmissive protective window which contacts the matrix electrode and holds it in contact with the dielectric member that bounds the radiation emitting region, the planar pattern of radiation emitted from the source exiting the source though the protective window.

20. The radiation source of claim 18 additionally comprising a spacer element that borders a periphery of the radiation emitting region, the spacer element disposed between the dielectric member and the two dimensional surface of the base electrode that bounds the radiation emitting region.

21. The radiation source of claim 18 wherein the gas disposed in the radiation emitting region is injected though a gas inlet in the base electrode.

22. The radiation source of claim 18 wherein in the gas disposed in the radiation emitting region is selected from a group of ionizable gases capable of excimer excitation including the following: NeF, $Ar_2$, $Kr_2$, $F_2$, $Xe_2$, ArCl, KrI, ArF, KrBr, KrCl, KrF, XeI, $Cl_2$, XeBr, $Br_2$, and $Ar/CF_4$.

23. The radiation source of claim 19 wherein the radiation transmissive protective window is urged against the matrix electrode and functions to reinforce the dielectric member as a result of evacuating a gap region between the protective window and the dielectric member resulting in a negative pressure condition causing the protective window and dielectric member to tightly sandwich the matrix electrode.

24. The radiation source of claim 18 wherein the matrix electrode is a conductive, mesh material.

25. The radiation source of claim 18 additionally including a radiation transmissive filter chamber member spaced apart from the radiation transmissive protective window to define a filter chamber and an absorber gas injected into the filter chamber to absorb certain wavelengths of radiation emitted from radiation emitting region such that a reduced range of radiation wavelengths is emitted from the radiation source through the filter chamber member.

26. The radiation source of claim 25 wherein the absorber gas includes oxygen.

27. The radiation source of claim 18 wherein the emitted radiation is in the UV wavelength range.

28. The radiation source of claim 18 wherein the emitted radiation is in the VUV wavelength range.

29. A semiconductor wafer treatment system for treatment of a semiconductor wafer by emitted radiation, the semiconductor wafer treatment system comprising:
   a) a wafer confining structure for supporting a semiconductor wafer; and
   b) a radiation source mounted to the wafer confining structure and emitting radiation for treatment of the wafer, the radiation source including:
      1) a base electrode having a two dimensional surface bounding a radiation emitting region;
      2) an assembly including:
         I) a radiation transmissive dielectric member bounding the radiation emitting region and spaced from the base electrode by the radiation emitting region for transmitting radiation from the radiation emitting region to a wafer treatment region; and
         ii) a two dimensional, radiation transmissive matrix electrode in contact with the transmissive member in a plane generally parallel to the two dimensional surface of the base electrode that bounds the radiation emitting region;
      3) a power supply for energizing the base and matrix electrodes;
      4) an ionizable gas capable of excimer excitation disposed to the radiation emitting region for ionization by a field set up between the base and matrix electrodes; and
      5) the power supply energizing the base electrode and the matrix electrode to generate an electrical field resulting in excimer excitation of the ionizable gas in the radiation emitting region thereby generating a planar pattern of radiation emitted from the source exiting the source though the matrix electrode.

* * * * *